United States Patent [19]
Valdettaro
[11] 3,924,209
[45] Dec. 2, 1975

[54] UHF TUNER HAVING A SIMPLIFIED AFC DEFEAT MECHANISM

[75] Inventor: Alarico A. Valdettaro, Bloomington, Ind.
[73] Assignee: Sarkes Tarzian, Inc., Bloomington, Ind.

[22] Filed: Oct. 16, 1974
[21] Appl. No.: 515,209

Related U.S. Application Data

[60] Division of Ser. No. 350,742, April 13, 1973, Pat. No. 3,842,683, which is a continuation of Ser. No. 174,722, Aug. 25, 1971, abandoned.

[52] U.S. Cl. .......... 334/39; 325/457
[51] Int. Cl.² .......... H03J 5/00
[58] Field of Search .......... 334/39, 88; 74/10, 41; 325/457

[56] References Cited

UNITED STATES PATENTS

| | | | |
|---|---|---|---|
| 3,365,962 | 1/1968 | Smith | 334/51 |
| 3,466,549 | 9/1969 | Milnes | 334/39 |
| 3,689,853 | 9/1972 | Badger et al. | 334/88 |
| 3,842,683 | 10/1974 | Valdettaro | 74/10.41 |

*Primary Examiner*—Alfred E. Smith
*Assistant Examiner*—Wm. H. Punter
*Attorney, Agent, or Firm*—Mason, Kolehmainen, Rathburn & Wyss

[57] ABSTRACT

A continuously variable UHF tuner arrangement is provided wherein a single channel selector shaft is provided with a detent position for each of the 70 UHF television stations and a highly accurate detent mechanism is employed to return the channel selector shaft to any one of said detent positions with extreme accuracy. As a result, the tuning elements of the UHF tuner may be accurately aligned to different UHF stations corresponding to said detent positions and a non-ambiguous digital dial arrangement is employed to indicate to the operator exactly which UHF station is being received.

Facilities are provided in such a UHF tuning arrangement for disabling an associated AFC control circuit during periods when the selector shaft is moved between said detent positions and during periods when a fine tuning adjustment is being made.

4 Claims, 32 Drawing Figures

UHF TUNER HAVING A SIMPLIFIED AFC DEFEAT MECHANISM

The present invention is a division of my copending application Ser. No. 350,742, filed Apr. 13, 1973, now U.S. Pat. No. 3842683, which is itself a continuation of parent application Ser. No. 174,722, filed Aug. 25, 1971, now abandoned, all of which applications are assigned to the same assignee.

The present invention relates to UHF tuner mechanisms more particularly to UHF tuning arrangements employing continuously variable UHF tuning elements which are rotatable by means of a common main tuning shaft, and the invention has for a primary object the provision of a UHF tuning arrangement of this type which is comparable in many respects to the tuning arrangements conventionally used for VHF tuners.

For many years various arrangements have been employed as continuous drive mechanisms for UHF tuners of the type having a continuously rotatable main tuning shaft. Certain arrangements have employed a tuning knob which is connected by means of gears, pinch wheels, cams and cam followers, ball-planetary mechanisms, or a string drive to the main tuning shaft with driving ratios which are variable all the way from 70:1 to 14:1. Some of these drive arrangements have employed two-speed mechanisms whereby the UHF band may be rapidly covered by motion in one direction and then a fine tuning operation is performed by rotating the tuning knob in the other direction to tune in the desired UHF station. Two separate knobs have also been employed for such two speed UHF tuning systems.

The dial arrangements for such continuous drive UHF tuners, whereby the channel number of the selected UHF station is indicated, have been only approximate and can be called analog-type indicator arrangements since the dial moves continuously with the tuning knob. In many instances, these indicators have only certain channel numbers indicated on the dial with dots in between to show the approximate position of other channels. Calibration accuracy of such dial arrangements is only approximate and the UHF station to which the UHF tuner is actually tuned varies as much as plus or minus three UHF channels from the channel numbers indicated on the dial. Also, in these continuous drive UHF tuner arrangements the dial moves during the fine tuning operation. The dial indication achieved with such tuners is very ambiguous and the operator relies primarily on his knowledge of which UHF stations are broadcasting in his area when he tunes in a given station. Examples of such continuous drive fine tuning arrangements are shown, for example, in Valdettaro U.S. Pat. No. 3,518,888, Badger U.S. Pat. No. 3,446,083, Meadows, et al U.S. Pat. No. 2,909,934, Krepps U.S. Pat. No. 2,665,377 and Sperber U.S. Pat. No. 2,756,599.

Some attempts were also made at a relatively early date to provide a decade type of dial indication for UHF in conjunction with double superheterodyne type circuits, usually tuned by separate tuning knobs. The double superheterodyne type of UHF tuner was not satisfactory because of the use of two local oscillators with its attendant complexity and the spurious responses which were encountered in the field. Examples of such double superheterodyne UHF systems are shown in Machlin U.S. Pat. No. 2,851,593 and Scandurra U.S. Pat. No. 2,785,297.

Other attempts have also been made to provide individual tuning to different UHF stations wherein separate groups of tuning elements were provided corresponding to a predetermined group of UHF channels. Decade dial arrangements were proposed for certain of these arrangements which employed multiple sets of UHF tuning elements. However, with such multiple sets of UHF tuning elements it was found to be impossible to commutate or switch the UHF tuned circuits and reset the tuner back to the same channel with any degree of accuracy, so that the proposed decade dial arrangements were unsatisfactory because they would indicate the wrong channel number. Another problem encountered in such proposed decade dial arrangements was the inability to manufacture the multiple sets of tuning elements with the precision necessary to substitute one set for another and have the resultant tuning frequency precise enough to utilize a fixed number type of dial indicator. Furthermore, UHF tuners employing multiple sets of UHF tuning elements were extremely complex and expensive and were completely unsatisfactory from an economic standpoint. Examples of such multiple tuning set arrangements are shown, for example, in Koch U.S. Pat. No. 2,821,624, Rieth U.S. Pat. No. 3,327,221 and Kostecki U.S. Pat. No. 2,886,700.

In February of 1970 the Federal Communications Commission issued a ruling requiring that similar types of tuners be used to receive both UHF and VHF signals in a given television set, insofar as the customer operation of such tuners is concerned. Furthermore, compliance with this ruling was requested on an increasing percentage of models per year, 10% of the models being required to comply with this ruling in 1971, 40% in 1972, 70% in 1973 and 100% in 1974. Since most, if not all VHF tuners presently employ a fixed stop or detent position for each VHF channel and at least half of these VHF tuners employ so-called memory or preset fine tuning whereby the fine tuning knob is adjusted once for each channel and its position thereafter memorized or preset for subsequent selections of that channel, the FCC ruling actually required that UHF tuners be provided with detent positions for UHF stations and, when used with preset VHF tuners, that they also embody memory or preset UHF fine tuning.

At the time of this ruling by the FCC, various types of detented, preset UHF tuners had been developed and were available in the marketplace. In general, these detented, preset UHF tuner arrangements provided a relatively small number of detent or stop positions, and in each position the tuner was adjustable by an independent, noninteracting fine tuning adjustment so that a particular one of the 70 UHF channels could be selected and assigned to that detent position of the UHF tuner. Individual UHF stations could thus be preset at each detent stop for repeated access without requiring further fine tuning on the part of the operator. However, the number of such UHF stations which could be selected was limited to the total number of detent positions available, which was always substantially less than the total number of UHF channels in the UHF band. UHF tuners of this detented, preset type are shown, for example, in copending Badger application Ser. No. 856,277 filed Sept. 9, 1969 now abandoned and assigned to the same assignee as the present invention, Schwartz U.S. Pat. No. 3,513,418, Smith U.S. Pat. No. 3,205,720, Harten U.S. Pat. No. 3,474,362, Sperber U.S. Pat. No. 3,459,055, Berenbaum, et al U.S. Pat. No. 3,447,386 and Kennedy U.S. Pat. No. 3,152,487.

The dial indicator arrangements initially employed with most of these detented, preset UHF tuner arrangements were only approximate analog arrangements employing a drum, disc or strip type indicator in which every third UHF channel number, or the like, was displayed. Some of these detented, preset UHF tuner arrangements employed a dial indicator system whereby the exact channel number could be added by the customer at each detent position by means of slip-on or stickon tags of some special design. The total number of exact channel numbers which could be indicated was never equal to the total number of UHF channels in the UHF band, and, in most instances, permitted exact indication of only six UHF channels. Furthermore, while the stick-on tag, once added by the customer, gave a nonambiguous dial indication of a specific UHF channel, any further movement or adjustment of the separate fine tuning knob of such tuners could render such dial indication totally meaningless. This is because the fine tuning knob of such tuners covers the entire UHF band and a station different from the one indicated on the dial can be tuned in by only a slight re-adjustment of the memory fine tuning knob. In effect, therefore, such preset dial arrangements were ambiguous in that the operator was not prevented from tuning in a UHF station different from the one indicated on the dial. In contradistinction, conventional VHF tuners limit the range of fine tuning so that under normal receiving conditions the operator is prevented from tuning in a channel different from the one indicated on the VHF dial.

In June of 1970 the Federal Communications Commission clarified its earlier ruling of February 1970 and at that time stated that the channel indication for UHF tuners should be identical to that employed for VHF tuners. Since all VHF tuners, whether preset of not, indicate that exact channel being received, UHF tuners were thereby required to have such exact channel indication, in accordance with the above-described compliance time schedule. The detented, preset UHF tuners then available were accordingly arranged so that the customer could add on a channel tag at each detented position after the channel had been selected by the customer for reception in his area. Furthermore, such add-on tags had to be inserted by the customer without the use of tools, according to FCC requirements. This involved customer accessibility to the indicating elements which carried these tags and required removable knobs, panels, and the like. While such arrangements were tolerable, although obviously not satisfactory, in 1971 when a relatively small percentage of the total UHF tuner production was required to be comparable with VHF tuners, it is recognized that the means for setting the exact channel indication by the customer provided in these detented, preset UHF tuners was not a practical solution, particularly when considered in connection with the total compliance required in 1974. This is particularly true because the detented, preset UHF tuners are considerably larger and more expensive than a manual VHF tuner and would be economically unsuitable for incorporation in the large volume, low-cost portion of the total line of television receivers of each manufacturer. Nevertheless, all detented preset UHF tuners have now been or are being modified to accept channel tags added by the customer in the field without the use of tools, which further increases the cost of these UHF preset tuning systems and makes this type of tuner very unattractive for medium and lower-priced television receivers.

Several other UHF tuner arrangements have been heretofore proposed which provided a separate detent position for each of the 70 UHF channels and, in some instances, attempted to provide exact channel indication for each UHF station. Examples of such designs are shown, for example, in Dickinson, et al U.S. Pat. No. 3,492,608, Naber, et al U.S. Pat. No. 3,307,414, Smith U.S. Pat. No. 3,365,962 and in Zenith tuner manual TM-11, Part No. 923-461. However, due to the poor resettability characteristics of these designs the dial indication was not comparable to VHF tuners. In conventional manually operated VHF tuners the dial indication is nonambiguous because the resettability and channel alignment specifications for VHF tuners are sufficiently precise that the operator is assured that the VHF station which is indicated on the dial is, in fact, the one being received. The 70 detent UHF tuning arrangements heretofore employed, and as exemplified in the above-listed patents and designs, had such inaccurate detent mechanisms, poor resettability characteristics and nonlinear alignment characteristics that exact dial indication was not feasible and in fact would mislead the operator since he could never be sure that the UHF station indicated on the dial was the one actually being received. Furthermore, the touch and feel of the detent mechanisms of many of these 70 stop UHF tuners was indistinct to the operator as he grasped the tuning knob and the torque necessary to turn the tuning knob and angular spacing between detent positions were not the same as VHF tuners. Accordingly, there was a great need at the time of the present invention for a UHF tuning arrangement which would be comparable, insofar as customer operation is concerned, with VHF tuners, and which could be used to comply with the increasingly broad requirements of the FCC ruling in 1972 and subsequent years.

It is, therefore, a further object of the present invention to provide a new and improved UHF tuner arrangement which avoids one or more of the above-discussed disadvantages of the prior art arrangements.

It is another object of the present invention to provide a new and improved UHF tuning mechanism for a UHF tuner employing a continuously variable main tuning shaft, wherein the single station selector knob of the tuner is provided with a detent arrangement having a detent interval and touch to the operator which is comparable to conventional VHF tuning mechanisms.

It is a further object of the present invention to provide a new and improved UHF tuning mechanism for a continuously variable UHF tuning shaft wherein a separate detent position is provided for each of the seventy UHF television stations while at the same time providing substantially increased accuracy of resettability of the UHF tuner to a particular UHF station within the UHF band.

It is a still further object of the present invention to provide a new and improved UHF tuning mechanism for continuously variable UHF tuners wherein the input shaft which is manipulated by the operator is provided with ten equally spaced detent positions and is rotated seven revolutions to cover the entire UHF band, thereby facilitating direct digital indication of the channel numbers of all UHF stations in an economical manner.

It is another object of the present invention to provide a new and improved UHF tuning mechanism for a continuously variable UHF tuner wherein a single station selector knob controls selection of individual television stations within the UHF band which are indicated by means of tens and units discs which are mounted concentrically with said knob, thereby to provide an arrangement which is comparable to the digital indication provided by conventional VHF tuning mechanisms.

It is a further object of the present invention to provide a new and improved UHF tuning arrangement for continuously variable UHF tuners wherein the channel numbers of individual television stations within the UHF band are indicated by means of a digital indicator of the decade type and a stop mechanism is provided which positively prevents display of channel numbers outside the UHF band.

It is another object of the present invention to provide a new and improved UHF tuning arrangement for continuously variable UHF tuners wherein a simplified decade indicator arrangement is provided for indicating the exact channel number of each television station in the UHF band, said indicator arrangement being positioned outside the front panel of the cabinet in which the UHF tuner is positioned in a manner similar to many conventional VHF indicator knob arrangements.

It is still another object of the present invention to provide a new and improved UHF tuning arrangement for continuously variable UHF tuners wherein the channel selector shaft is provided with a separate detent position for each of the seventy UHF television stations and a fine tuning shaft concentric with said selector shaft is provided for precise tuning to a selected UHF station, said selector shaft and said fine tuning shaft being arranged to receive concentric tuning knobs comprising an outer fine tuning knob connected to said fine tuning shaft and an inner channel selector knob connected to said channel selector shaft.

It is a further object of the present invention to provide a new and improved UHF tuning arrangement for continuously variable UHF tuners wherein a channel selector shaft is provided having a separate detent position for each of the seventy UHF television stations and wherein a simplified and economical indicator dial structure is provided for indicating the detent positions of said channel selector shaft.

It is another object of the present invention to provide a new and improved UHF tuning arrangement for continuously variable UHF tuners wherein a separate detent position is provided for each of the seventy UHF stations and the frontal area and panel space required thereby is minimized.

It is still another object of the present invention to provide a new and improved UHF tuning arrangement for continuously variable UHF tuners wherein a separate detent position of the main tuning shaft of the UHF tuner is provided for each of the seventy UHF television stations by means of a highly accurate detent mechanism which is effective to return the main tuning shaft to a given UHF detent position with extremely good resettability characteristics.

It is a further object of the present invention to provide a new and improved UHF tuning arrangement of the continuously variable main tuning shaft type, wherein a linear drive mechanism is employed to rotate the main tuning shaft, the tuning elements carried by said main tuning shaft are accurately aligned to receive a particular UHF channel at each of seventy stop positions of said main tuning shaft, and a detent mechanism is provided which is effective repeatedly to return said main tuning shaft to any one of said aligned UHF stop positions with a high degree of accuracy.

It is another object of the present invention to provide a new and improved UHF tuning arrangement for continuously variable UHF tuners wherein a single channel selector shaft is provided with a detent position for each of the seventy UHF television stations and facilities are provided for disabling an AFC control circuit associated with the tuner during periods when said selector shaft is moved between said detent positions.

It is still another object of the present invention to provide a new and improved UHF tuning arrangement for continuously variable UHF tuners, wherein a single channel selector shaft is provided with a detent position for each of the seventy UHF television stations, fine tuning means are provided for adjusting the tuning of the continuously variable UHF tuner in each of said detent positions, and facilities are provided for disabling an AFC control circuit associated with the tuner during periods when a fine tuning adjustment is being made.

It is another object of the present invention to provide a new and improved UHF tuning arrangement for continuously variable UHF tuners which provides individual detent positions for each UHF station; nonambiguous direct digital indication for each UHF station is of small size and greatly improved reliability, and can be manufactured on a mass production basis at low cost.

Briefly, in accordance with the present invention, the single channel selector shaft of the UHF tuning mechanism is provided with 10 equally spaced detent positions so that one revolution of this shaft will cover 10 of the 70 UHF stations. A units dial is directly connected to said selector shaft to provide units digit information concentric with the selector shaft. This units dial drives a decade or tens disc, also concentric with the selector shaft, which carries tens digit information so that an extremely simple and economical, direct digital indication of each UHF channel number is provided. The detented input shaft, which is rotated seven revolutions to cover the entire UHF band, is connected to the continuously variable main tuning shaft of the UHF tuner through a step-down gearing arrangement comprising a series of loosely meshed spring loaded gears which have a ratio of approximately 14:1 so that the accuracy with which the selector shaft is detented is magnified or multiplied by a factor of 14 and the UHF main tuning shaft can be reset to a given UHF stop position with extremely high accuracy. Furthermore, the extremely accurate detent mechanism is employed to achieve the alignment of the tuning elements carried by the main tuning shaft of the UHF very accurately to each of the 70 UHF stations at fixed increments of approximately 2.57° of rotation of the main tuning shaft corresponding to the 70 detent positions of the selector shaft. Preferably, the alignment of the UHF tuning elements is sufficiently precise that the tuning never deviates more than plus or minus 3 megacycles (i.e., one-half the width of one channel) from the exact frequency of the station indicated by the digital dial so that a nonambiguous dial indication is provided and the tuning operation of the UHF tuner of the present invention, insofar as the customer is concerned, is quite comparable to the operation of VHF tuners.

The invention, both as to its organization and method of operation, together with further objects and advantages thereof, will best be understood by reference to the following specification taken in connection with the accompanying drawings, in which.

Figures 18, 19, 23, 24, 25, 26:
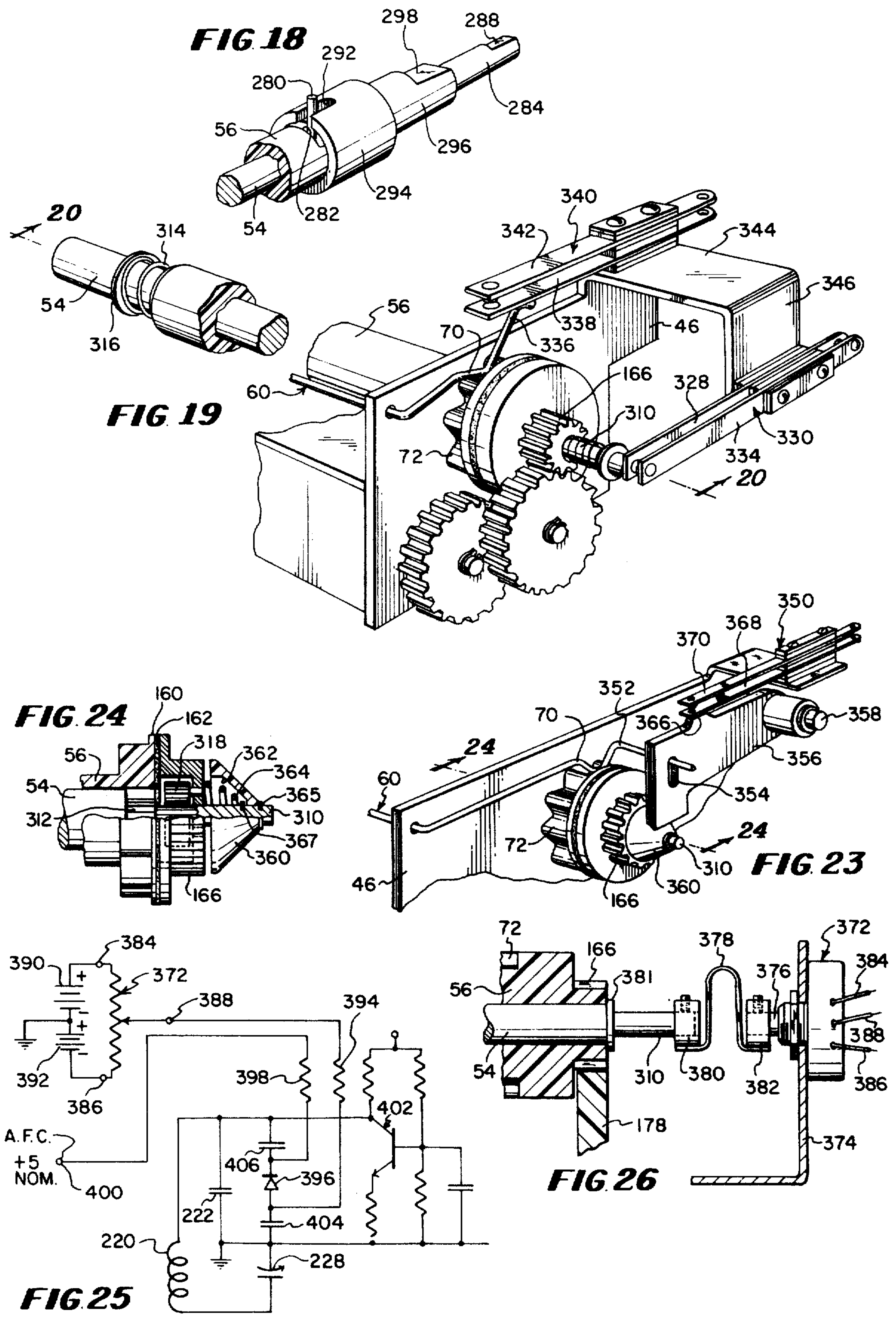
FIG. 18 is a perspective view of the knob arrangement of FIG. 17.
FIG. 19 is a fragmentary perspective view of an alternative embodiment of the invention wherein the AFC circuit of the associated television receiver may be defeated during both UHF fine tuning and UHF channel selecting operations.
FIG. 23 is a perspective view of an alternative embodiment of the invention wherein there is incorporated a different AFC defeat arrangement for UHF fine tuning and UHF channel selecting operations.
FIG. 24 is a sectional view taken along the line 24—24 of FIG. 23.
FIG. 25 is a schematic diagram of an alternative embodiment of the invention wherein electronic fine tuning is incorporated.
FIG. 26 is a fragmentary side view similar to FIG. 4, of the electronic tuning embodiment of FIG. 25.

Referring now to the drawings, and more particularly to FIGS. 1 to 14, inclusive, thereof the present invention is therein illustrated as comprising a UHF tuner assembly indicated generally at 30, said assembly comprising a main base member or chassis 32 having a downturned front flange portion 34 which is adapted to be secured to the front panel 36 of the television receiver cabinet by any suitable means such as the bolts 38. The base member 32 is also provided with a rear downturned flange 40 which cooperates with the front flange 34 to define a recess within which the UHF tuner, indicated generally at 42, is positioned with the upper wall of this tuner being secured to the base plate 32 by means of the screws 44. The base plate 32 is provided with an upstanding rear wall 46, which is conveniently formed from the base plate 32, leaving the opening 48 therein, and the base member 32 is provided with a forward upstanding wall 50 which is also formed from the base member 32, leaving the opening 52 therein. The wall portions 46 and 50 are employed rotatably to mount an inner fine tuning shaft 54 and an outer UHF channel selector shaft 56, these shafts extending parallel to but spaced from the main tuning shaft, or rotor shaft 58 of the UHF tuner 42, the rotor shaft 58 extending through suitable clearance openings 58*a* and 58*b* in the rear wall of the tuner 42 and the chassis wall 40, respectively. The outer channel selector shaft 56 extends through suitable bearing openings in the wall portions 46 and 50, these openings preferably having sloping edges defining a pair of V-shaped bearing surfaces for the shaft 56. A U-shaped torsion spring element, indicated generally at 60, is provided with a bight portion 62 extends through an opening in the rear wall 46 and is positioned in a notch 64 in the front wall 50 and extends parallel to the channel selector shaft 56. The right-angle front end portion 66 of the torsion spring 60 is biased into engagement with the selector shaft 56 at a point just forward of the wall 50 and the right-angle rear end portion 68 of the torsion spring 60 has a V-shaped end portion 70 formed therein (FIG. 5) which is biased into engagement with the adjacent lobe shoulders of a 10-position detent wheel 72 which is formed integrally with the rear end portion of the channel selector shaft 56. The right-angle end portions 66 and 68 of the torsion spring 60 thus act also to bias the adjacent portions of the channel selector shaft 66 into engagement with the V-shaped bearing surfaces provided in the end walls 46 and 50 of the base plate 32 so that the channel selector shaft 56 is very accurately positioned to any one of the 10 detent positions established by engagement of the V-shaped portion 70 of the spring 60 with the detent wheel 72.

The channel selector shaft 56 is thus accurately positioned to 10 different detent positions, each representing a UHF station, during one revolution of the shaft 56 and this shaft is rotated seven revolutions to cover the entire UHF band of 70 channels. In accordance with an important aspect of the present invention, simple concentric dial indicator arrangement is provided, which may be mounted either inside of or outside of the front panel 36 and is directly supported by and driven from the channel selector shaft 56. In the embodiment of FIGS. 1 to 14, inclusive, this dial indicator arrangement is positioned outside of the front panel 36. More particularly, a combined channel selector knob and units indicator disc member, indicated generally at 76 (FIG. 6) is mounted on the forward end portion of the channel selector shaft 56, outside of the front panel 36, by means of a D-shaped opening 78 provided in a hub portion 80 of the member 76, the opening 78 conforming to the flat 82 provided on the end portion of the channel selector shaft 56 so that the channel selector knob 84 of the member 76 may be grasped by the operator and rotated to turn the channel selector shaft 56 to any desired UHF position. The member 76 is also provided with a transversely extending units disc portion 86 which is preferably transparent and has printed thereon black numerals 88 corresponding to the 10 units digits of the UHF channel numbers at 10 equally spaced positions along the periphery of the disc portion 86.

A masking member 90, which also acts as a support for the tens disc 92 of the dial indicator arrangement, is mounted on the channel selector shaft 56 ahead of the panel 36 by means of a hub portion 94 which is positioned on the selector shaft 56, the member 90 being restrained from rotation about the shaft 56 by means of a rearwardly extending pin 96 which is secured thereto and extends through an opening 98 in the front panel 36 and into an opening 100 (FIG. 4) in the chassis wall 34. The masking member 90 is provided with an annular forwardly extending rim portion 102 which acts as a guide or centering arrangement for the tens disc 92 so as to position this disc concentrically with the axis of the selector shaft 56. A forwardly extending pin 104 is also secured to the masking member 90 and acts as a bearing post for a trip pinion indicated generally at 106 which is rotatably positioned on the post 104. The trip pinion 106 is provided with three equally spaced full length teeth 108 and three equally spaced teeth of shorter length 110 which are positioned equidistantly between the teeth 108. The tens disc 92 is provided with internal gear teeth 112 which are arranged to be in mesh with the teeth 108 and 110 of the trip pinion 106 when the disc 92 is positioned on the annular rim 102 of the masking member 90. The tens disc 92 is also preferably transparent and has imprinted thereon a series of numerals 114 corresponding to the tens digits of the channel numbers 14 to 83 which are assigned to the UHF band. The tens disc 92 is rotated one tens digit increment for each revolution of the units disc 86 by means of a pair of tripper teeth 116 (FIG. 13) which are formed in the rear side of the units disc 86. More particularly, the disc 86 is provided with a relatively shallow outer annular recess 118 and a deeper central recess 120. The tripper teeth 116 are formed at the level of the recess 118 and are positioned so as to contact one of the short teeth 110 on the tripper pinion 106 which is positioned between a pair of longer teeth 108. The longer teeth 108 normally ride on the wall 122 of the deeper recess 120 so that the tripper pinion is normally held against rotation during rotation of the units disc 86. As a result, since the tripper pinion 106 is also in mesh with the gear teeth 112 of the tens dial 92, the tens dial 92 is prevented from moving as the longer teeth 108 ride along the shoulder 122.

Figures 6, 7, 8, 9, 10, 11, 12:
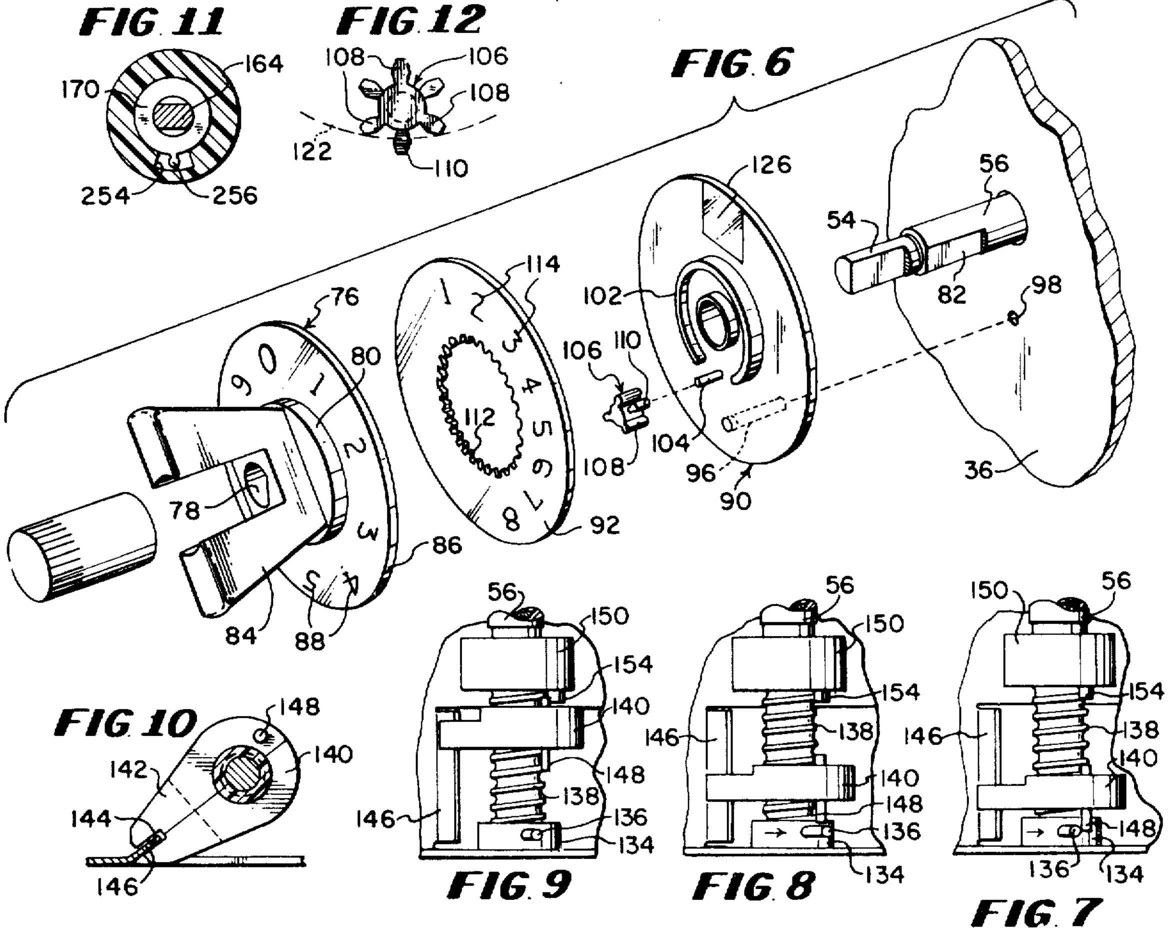
FIG. 6 is an exploded view of the elements of the decade dial indicator arrangement of the present invention and employed in the tuner arrangement of FIG. 2.
FIGS. 7, 8 and 9 are fragmentary plan views of the tuner of FIG. 2 showing the UHF stop mechanism in various positions.
FIG. 10 is a fragmentary sectional view taken along line 10—10 of FIG. 2.
FIG. 11 is a sectional view taken along line 11—11 of FIG. 4.
FIG. 12 is a sectional view taken along the line 12—12 of FIG. 4.

More particularly, referring to FIG. 12, wherein the surface 122 is shown in dotted lines, it will be seen that one of the short teeth 110 extends outwardly beyond the contour of the surface 122 at the level of the recess 118 and hence can be engaged by one of the tripper teeth 116. However, the space 124 between the tripper teeth 116 is cut away to the full depth of the recess 120. Accordingly, when one of the tripper teeth 116 engages one of the short gear teeth 110 on the tripper pinion 106, this pinion is rotated while the adjacent long gear tooth 108 rides in the vertical recess 124. As the units disc 86 is rotated at the tenth or decade position at which a shift of the tens disc 92 is required, the trip pinion 106 is rotated by an amount sufficient to bring the next one of the numerals 114 into the tens digit position. In this position the next pair of long gear teeth 108 are positioned properly to ride along the surface 122 as the units disc is rotated for the next revolution.

In order that the channel numbers on the tens and units discs 92 and 86 may be clearly perceived by the operator when the dial indicator is positioned outside the front panel 36, the entire front surface of the masking member 90, including the surfaces of the annular rim 102, are preferably coated with a black, light-absorbing material except in the area 126 immediately behind the tens and units numerals constituting the channel number to which the selector knob 56 has been adjusted. The area 126 is either uncoated, if the disc 90 is of white translucent material, or, in the alternative, the area 126 may be coated with a bright fluorescent or daylight fluroescent paint of a color having the maximum contrast with the color of the numerals 88 and 114 on the discs 86 and 92, respectively. With such an arrangement, the tens and units numerals falling within the area 126 are given maximum contrast for incident light from the room while at the same time all of the other numerals on the discs 86 and 92 are essentially masked from view since they are in front of the darkened or contrasting area of the masking member 90.

While the dial indicator arrangement of the present invention is shown in FIGS. 1 to 14, inclusive, as positioned in front of the front panel 36 of the television cabinet, it will be understood that this same dial indicator arrangement may be employed in situations where the dial indicator is to be positioned behind the front panel. Thus, if a front panel 36*a* is positioned in front of the tens and units discs 92 and 86, as indicated in dotted lines in FIG. 4, a viewing window 128 is provided in the panel 36*a* which matches the viewing area 126 of the disc 90. With such an arrangement all of the other numerals 88 and 114 are blocked from view by the front panel 36*a*. If desired, a dial indicator light may be positioned behind the disc 92 so as to provide back illumination for the channel numbers through the window 128. Also, this dial indicator light may be energized only when the associated VHF tuner is in the UHF receiving position so that the UHF channel numbers will become visible only during periods of UHF reception, as it will be readily understood by those skilled in the art. Since the knob structure 76 has to accommodate the opening 130 in the front panel 36*a*, the forward knob portion 84 of the member 76 may be suitably modified to have a maximum diameter less than the opening 130 or, in the alternative, the member 76 may be divided into two portions, as indicated by the dotted line 132 in FIG. 4, both of these portions having a D-shaped opening similar to the opening 78 so that the outer knob portion may be placed on the selector shaft 56 after the units dial 86 has been positioned behind the front panel 36*a*. When the panel 36*a* is positioned outside the tens and units discs the pin 96 on the member 90 is still positioned in the hole 100 of the wall 50 so that the member 90 is prevented from rotating.

As stated above, the channel selector shaft 56 is rotated seven full revolutions to cover the entire UHF band. In accordance with the present invention, a positive stop arrangement is provided for the shaft 56 at each end of its travel so as to prevent display of channel numbers beyond the UHF band, i.e. lower than channel 14 or higher than channel 83, in the viewing area 126. A stop mechanism which positively prevents the display of such numbers is important so that the operator does not become confused when he sees an unassigned channel number and attempt to turn the knob in the wrong direction with resultant damage to the mechanism. In the arrangement of the present invention the channel selector shaft 56 is prevented from axial movement by means of a C washer 132 which is positioned adjacent the chassis wall 50 and a collar 134 which is positioned on the other side of the wall 50 and is secured to the channel selector shaft 56 by means of a suitable set screw or the like. The collar 134 rotates with the channel selector shaft 56 and carries a stop pin 136 which projects radially outwardly from the collar 134. The outer surface of the channel selector shaft 56 is provided with a series of threads 138 which control movement of a follower nut 140 provided with an internal threaded opening in engagement with the threads 138. The nut 140, which may be a split nut the two halves of which are held together by a set screw, or the like, is provided with an extension portion 142 (FIG. 10) which has a slot 144 in the end thereof which is adapted to receive an upturned flange portion 146 which is struck out of the base member 32. Accordingly, the nut 140 is prevented from rotating and, as the channel selector shaft 56 is related, the nut 140 moves along the threads 138 at a rate determined by the pitch of these threads. The nut 140 carries a pin 148 which projects from both sides of the nut 140 and extends parallel to the selector shaft 56. A second collar 150 is also secured to the selector shaft 56 by means of a set screw 152 and rotates with this shaft, the collar 150 carrying a forwardly projecting pin 154. When the selector shaft 56 has been moved to the channel 83 detent position at the upper end of the UHF band, the nut 140 has been moved forwardly by an amount sufficient that the pin 136 on the collar 134 is positioned adjacent to but not against the pin 148 on the nut 140, as shown in FIG. 7, sufficient clearance being provided between the pins 136 and 148 to permit positive seating of the detent spring 70 between the lobes of the wheel 72 in the channel 83 detent position thereof. However, when the operator attempts to turn the channel selector shaft 56 in a clockwise direction, the pin 148 positively prevents further movement of the shaft 56 by an amount sufficient to bring the next units numeral 88 into the area 126. Since the shaft 56 rotates 36 degrees between detent positions and the units dial 86 is directly connected thereto, engagement of the pins 136 and 148 is effective to prevent the next numeral 88 from being seen by the operator.

When the channel selector shaft 56 is rotated one full revolution away from the channel 83 position, the nut 140 has been moved rearwardly by an amount sufficient that the pin 136 on the collar 134 misses the pin 148, as shown in FIG. 8. Accordingly, the selector shaft is unrestrained and may be moved through another six revolutions during which the nut 140 is moved rearwardly to the position shown in FIG. 9. When the selector shaft 56 has been moved to this channel 14 position the rear end of the pin 148 is positioned adjacent the pin 154 carried by the collar 150. Accordingly, if the operator attempts to move the selector shaft 56 in a counterclockwise direction, the pin 154 engages the rear end of the pin 148 and positively prevents movement of the selector shaft 56 by an amount sufficient to bring the next units numeral 88 into viewing position. In this connection, it will be noted that the stop mechanism of the present invention, and specifically the pins 136 and 154, are an integral part of the selector shaft 56 and move with this shaft until interference with the pin 148 occurs. Furthermore, the units dial 86 is mounted on and rotates as an integral part of the selector shaft 56 so that the stop action produced by interference with the pin 148 directly controls the position of the units disc 86. As a result, the units disc 86 is positively prevented from rotating by an amount sufficient to prevent the display of the next digit 88.

While the selector shaft 56 is accurately positioned by engagement of the torsion spring portion 70 with the index wheel portion 72 of the shaft 56, it is necessary to transmit this detent position to the rotor shaft 58 of the UHF tuner 42 with a high degree of accuracy. Furthermore, since the selector shaft 56 rotates seven revolutions to cover the entire UHF band it is also necessary to provide a step-down gearing arrangement between selector shaft 56 and the rotor shaft 58 since the rotor shaft 58 rotates somewhat less than 180 degrees to cover the entire UHF band. To this end, the selector shaft 56 is provided with a radially extending flange portion 160 at the rear end thereof, this flange portion having a rearwardly extending annular face which acts as a clutch face on which is positioned a clutch pad 162. The fine tuning shaft 54 is provided with a rear end portion 164 which has a double D cross section and a gear member 166 is mounted on the end portion 164 and has an opening therein which matches the double D cross section of the end portion 164 so that the gear 166 rotates with the shaft 54.

The gear 166 is provided with a forwardly extending skirt portion 168 (FIG. 4) which forms a recess within which is positioned the extreme rear end 170 of the selector shaft 56, the forward end face of the skirt portion 168 forming a second clutch surface which is held in engagement with the clutch pad 162 by means of a coil spring 172 which is positioned between the rear surface of the gear 166 and a washer 174 carried on the end of the fine tuning shaft 54. The forward end of the fine tuning shaft 54 is held against the forward end of the selector shaft 56 by means of the C washer 176 so that the spring 172 is effective to hold the gear 166 in engagement with the selectro shaft 56 through the clutch pad 162. Accordingly, as the selector shaft 56 is rotated by manipulation of the knob portion 84, the gear 166 rotates in exact registration therewith.

Figures 1, 2, 2A, 3, 5, 13, 13A:
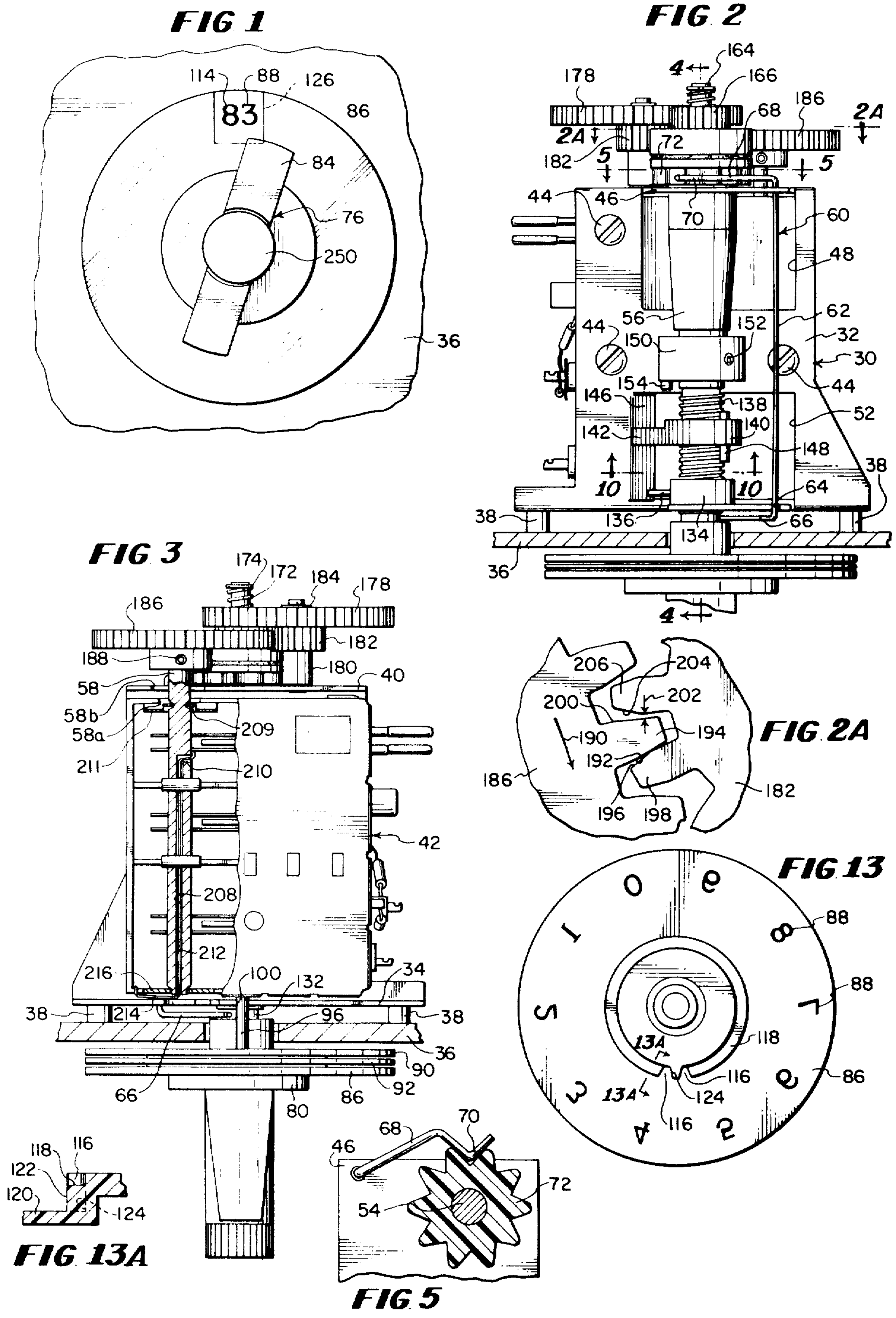
FIG. 1 is a front view of the knob and dial indicator arrangement of the UHF tuner of the present invention.
FIG. 2 is a top plan view of the tuner arrangement of FIG. 1.
FIG. 2A is a fragmentary sectional view taken along the line 2A—2A of FIG. 2.
FIG. 3 is a bottom view of the tuner arrangement of FIG. 2 with the cover of the UHF tuner partially broken away.
FIG. 5 is a fragmentary sectional view taken along the line 5—5 of FIG. 2.
FIG. 13 is a sectional view taken along the line 13—13 of FIG. 4.
FIG. 13A is a fragmentary sectional view taken along the line 13A—13A of FIG. 13.
Figure 4:
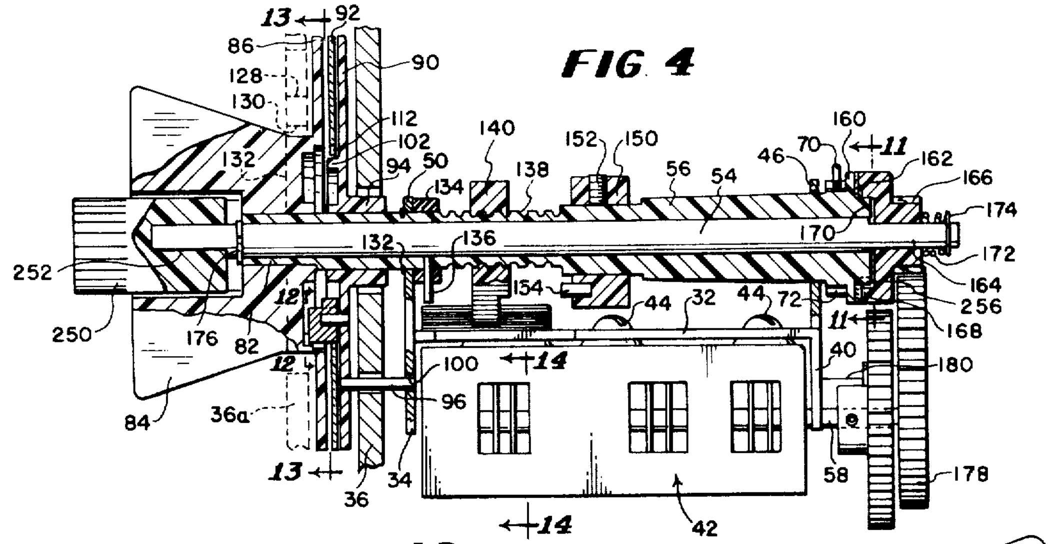
FIG. 4 is a sectional view taken along the line 4—4 of FIG. 2.

A relatively large gear 178 is rotatably mounted on a post 180 which is mounted on the rear wall 40 of the base plate 32 (FIG. 3). A small gear 182 is also rotatably mounted on the post 180 and rotates with the gear 178. Preferably, the gears 178 and 182 are molded as a single integral unit of plastic material, this gear being retained on the upper end of the post 180, which is of reduced cross section, by means of the C washer 184. Another large gear 186 is mounted on the rotor shaft 58 of the UHF tuner 42 by means of a set screw 188 provided in the hub portion of the gear 186, the teeth of the gear 186 being in mesh with the teeth of the gear 182.

The gear ratios of the gear pairs 166, 178 and 182, 186 are chosen such that the required step-down ratio, of approximately 14 to 1, is provided between the selector shaft 56 and the UHF rotor shaft 58. Furthermore, in accordance with an important aspect of the present invention, the gears 166 178, 182 and 186 are purposely positioned relative to one another so that the gear teeth thereof are loosely meshed. The rotor shaft 58 is also spring loaded in one direction. With such an arrangement it has been found that the step-down ratio of gearing to the rotor 58 acts to magnify or multiply the accuracy with which the detent wheel portion 72 of the selector shaft 56 is positioned. Thus, if the detent wheel 72 is resettable to 1.0° by the action of the end portion 70 of the torsion spring 60 thereon, the rotor shaft is reset in accordance with the present invention to one-fourteenth of that amount or .071°.

However, this extremely precise reset action is not obtainable if either the spring loading in one direction is eliminated, or if the gears which form the gear train are engaged on both sides of the teeth thereof, as in the case of scissors type gears which are normally used to eliminate backlash. By employing spring loading in one direction from the rotor shaft 58 back through the gear pairs 186, 182 and 178, 166 to the detent wheel 72, the individual teeth of each gear act only as positioning members or levers and only one face of each tooth is engaged by the corresponding face of the mating gear tooth of the other gear although the selector shaft 56 may be rotated in either direction to reach a particular UHF station. Thus, by mounting the gear sets 166, 178 and 182 and 186 with the gear teeth thereof, quite loosely enmeshed, the step-down gearing minimizes additional frictions, such as would be introduced with scissors type gears in which both sides of a gear tooth are pinched by the opposing teeth of the other gears.

With the arrangement of the present invention the accuracy with which the detent wheel 72 is positioned by the torsion spring 60 is magnified by a factor equal to the stepdown gear ratio, insofar as the rotor shaft 58 is concerned, provided the rotor shaft is spring loaded by an amount sufficient to maintain one face of the gear teeth in constant engagement. This biasing or loading force may be relatively light if the gears in the gear reduction train are freely rotatable on their bearings so that the gears making up this gear train may be relatively inexpensive plastic gears and yet will not be deformed or distorted in a manner which would reduce the detent accuracy and repeatability. As a result, no strong forces are employed to obtain the desired accuracy of detent and the individual gear teeth of each gear merely act as positioning levers which are constantly loaded in one direction. In FIG. 2A a fragmentary portion of the gears 182 and 186 is shown on a greatly expanded scale. Referring to this figure, the gear 186 is constantly urged in the direction of the arrow 190 by means of the spring loading force exerted on the rotor shaft 58, by means to be described in more detail hereinafter. As a result of this constant biasing force, the face 192 of the gear tooth 194 is continually held in engagement with the face 196 of the gear tooth 198 of the gear 182, and the opposite face 200 of the gear tooth 194 is spaced a substantial distance 202 away from the corresponding face 204 of the adjacent gear tooth 206 of the gear 182. If the selector shaft 56 is rotated so that the gear 182 moves in a counterclockwise direction, as viewed in FIG. 2A, the faces 192 and 196 of the respective gear teeth of the gears 186 and 182, or corresponding faces of the next pair of mating gear teeth, still remain in engagement due to the fact that a biasing force is continually exerted on the gear 186 in the direction of the arrow 190. In this connection it is also important to reset accuracy that the gears 178, 182, while being freely rotatable as a unit on the post 180, be mounted on this post without any play or looseness in the bearing since any such play will directly affect the reset accuracy.

A similarly precise positioning is also accomplished between the loosely meshed gear teeth of the gears 178 and 166. Accordingly, no additional frictions are introduced by pinching of the individual gear teeth of the gears in the gear reduction train so that the accuracy of positioning of the detent wheel 72 is multiplied by the factor of the gear step-down ratio due to the fact that the spring loading on the rotor shaft 58 can extend back through the entire step-down gear train and be effective precisely to follow the detented position of the wheel 72.

In order to provide the above-discussed biasing or loading force for the rotor shaft 58 so that one face of the teeth in the gear reduction train will remain in engagement for rotation of the selector shaft 56 in either direction, the rotor shaft 58 is provided with an opening 208 (FIG. 3) extending from the forward end thereof along the central axis of rotation to a point near the rear end thereof at which point a transverse slot 210 is provided. A torsion spring wire 212 is positioned within the opening 208 and is provided with an end portion which is received in the slot 210 so that the rear end of the spring 212 is fixed to and moves with the rotor shaft 58. The forward end of the spring 212 extends out through the opening 208 and is provided with a right-angle end portion 214 which is hooked over one wall 216 of the UHF tuner housing. The torsion spring 212 is so arranged that when one end thereof is positioned in the slot 210 and the other end is hooked over the wall 216, a biasing force is exerted on the rotor shaft 58 and hence upon the gear 186 secured thereto. This biasing force is reflected back through the loosely meshed gear pairs 186, 182 and 178, 166 so that the rotor shaft 58 may be accurately and precisely positioned in accordance with the setting of the detent wheel 72. It is also important that the rotor shaft 58 be very freely mounted in the tuner housing so that it can respond very accurately to the positioning information transmitted to it through the step-down gear train from the detent wheel 72. To this end, the rear end of the shaft 58 is mounted in a spring tongue portion 209 of a bracket 211 which is mounted on the inside of the tuner housing, the tongue 209 resiliently urging the forward end of the shaft 58 against an opening in the opposite housing wall 216. Both portions of the shaft 58 which engage the tongue 209 and wall 216 are provided with conical bearings to minimize friction in the mounting of the shaft 58. A similar rotor shaft mounting and biasing arrangement is disclosed in Badger, et al. application Ser. No. 856,277 filed Sept. 9, 1969 and reference may be had to said application for the details of such construction. It is also important that the UHF tuner housing be mounted in such a manner that forces exerted on the selector knob 84 by the operator will not result in distortion of the tuner housing which can produce frequency changes which interfere with reset accuracy. By mounting the tuner 42 on the chassis 32 by means of the bolts 44 on only one wall thereof, distortion of the tuner housing and detuning in response to pressure on the selector shaft is minimized. However, it will be understood that the tuner housing may be mounted on its supporting chassis in other orientations as, for example, by securing one end wall of the housing to the chassis, and still minimize such detuning.

The above-described detent arrangement of the present invention, while using only ordinary and inexpensive plastic gears for the illustrated gears 166, 178, 182 and 186, and with the simple spring loading of the torsion wire 212, has been found to give extremely good reset characteristics. The resettability of the tuner is determined by adjusting the selector shaft 56 from a particular UHF channel position to another channel position and then returning it to said particular channel position and noting how much the tuner is tuned away from the exact same frequency as before.

Furthermore, this operation must be performed by changing only the position of the selector shaft, as determined by the detent wheel 72, and without any fine tuning adjustment, AFC correction, or the like. The detent arrangement of the present invention provides a resettability which has substantially zero error at many points in the UHF band and will vary a maximum from the previous frequency setting of only about 150 kilocycles for any UHF channel within the UHF band. When it is considered that the UHF oscillator must be tuned to a frequency of approximately 931 megacycles at the upper end of the UHF band, it will be seen that the detent arrangement of the present invention provides an accuracy of approximately 160 parts per million maximum deviation, with the deviation at many points within the UHF band being substantially zero reset error.

Manually tuned VHF tuners are factory aligned to the precise frequencies of the assigned VHF channels to a very high degree of accuracy at each detent position of the selector shaft so that the VHF tuner operator is assured that the VHF station indicated by his dial is actually being received. He may then use his manual fine tuning adjustment to get the particular picture quality he desires. In order to provide a UHF tuning arrangement which is as nearly comparable with VHF tuners as possible, and in accordance with an important aspect of the present invention, the above-described detent mechanism is utilized during the alignment of the UHF tuner 42 so that a linear timing curve is provided which will essentially match the linear motion established by the above-described detent mechanism as determined by the detent positions of the wheel 72. This linearity is preferably such that the tuning characteristic will have a maximum deviation from the channel number indicated by the discs 86 and 92 of plus or minus 3 megacycles so that a nonambiguous dial indication is achieved and the operator is assured that the UHF channel indicated by the dial is actually being received. In this connection, it will be understood that the detent arrangement of the present invention, whereby greatly increased accuracy of reset is made possible, is necessary in order to align the UHF oscillator tuning elements to a desired degree of accuracy. This is because the reset error is random in character and if this error is large, as was the case with previous UHF tuner designs, it is impossible to align the UHF tuning elements to a given maximum deviation from linear. Although the tuning elements could be adjusted to give a certain frequency at a certain detent position of the selector shaft, there was no assurance that the next time this channel was selected the shaft would not be reset to a different position which would result in a tuning frequency different from the one originally established for that channel during alignment.

In the past, the RF and mixer sections of a continuously variable UHF tuner have been aligned and tracked by providing the rotor plates of the capacitive portions of the RF and mixer sections of the tuner with a series of radially extending slots whereby portions of the rotor plates of the variable capacitors can be adjusted by bending the same relative to the fixed stator plate or plates in each section of the tuner. The oscillator section of conventional UHF tuners is aligned only at certain points in the UHF band, such as at the high and low ends of the band and a chosen midpoint in the UHF band. The reason why the UHF oscillator did not in the past have to be accurately and precisely aligned to each UHF station over the entire band is that the fine tuning adjustment, in the case of two speed drive mechanisms, or the preset or memory tuning arrangement of detented preset UHF tuners could readily adapt to rather large variations in the alignment curve of the tuner. However, this large variation in alignment which is conventionally plus or minus 18 megacycles, (i.e. the width of three UHF channels), was acceptable only in conjunction with an analog type dial which gave a dial indication which was only a rough approximation of the channel being tuned.

Figure 14:
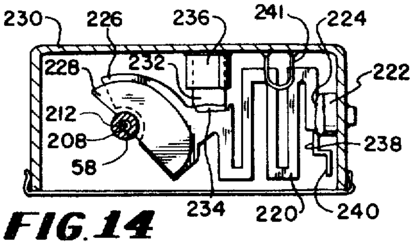
FIG. 14 is a sectional view taken along the line 14—14 of FIG. 4.

While the conventional method of slotting the rotor plate and adjusting individual rotor plate increments by bending has been entirely suitable for the RF and mixer sections of the UHF tuner, when an attempt is made to align the UHF tuner to the exact frequency of each of seventy UHF channels, and when it is realized that the total variation in movement of the rotor plates is somewhat less than 180°, it will be evident that the slotting of the rotor plates for individual UHF channel adjustment is completely impractical and unworkable. In accordance with the present invention, the rotor plates of the UHF oscillator section of the tuner are not slotted, since slotting and bending of the rotor plates introduces errors which cannot be exactly compensated for even by laborious and time consuming individual channel alignment. On the contrary, it has been found that the rotor and stator blades may be sheared and punched by conventional die methods to a very high degree of accuracy if the blade contour is initially chosen to give a nominalized linear variation of oscillator frequency with rotation of the rotor shaft. On the other hand, nonlinearities occur due to other factors which, in accordance with an important aspect of the present invention, are corrected where they occur rather than by attempting to bend slotted rotor plates to compensate for these errors. Thus, considering the oscillator section of the tuner 42, as shown in FIG. 14, the oscillator tuning line comprises a sinuous metal conductor 220 which is physically connected by soldering to a small fixed capacitor 222, as indicated by the solder joint 224 in FIG.

14, so that a rigid mounting is provided for one end of the line 220. The other end of the line 220 is formed integrally with a stator plate portion 226 which extends between a pair of rotor plates 228 which are mounted on the rotor shaft 58. As the rotor shaft 58 is rotated, the rotor plates 228 become more or less completely aligned with the stator plate section 226 and hence alter the capacity to ground at the upper end of the line 220, it being understood that the rotor shaft 58 is connected to ground at the adjacent wall partitions of the UHF tuner housing. The upper end of the tuner line is conventionally supported from the upper wall 230 of the tuner housing by means of a post 232 of dielectric material, such connection conventionally being made by means of a solder connection 234 between a flat section of the line 220 and the round post 232.

In assembling the tuner, the rotor plates 228 are first positioned in accurately spaced grooves in the rotor shaft 58 by means of a mechanical jig arrangement and these plates are then staked to the rotor shaft 58 so that they are accurately positioned thereon. The rotor shaft 58 with rotor plates assembled is then positioned within the bearing seats in the tuner housing and the stator plate portion 226 is aligned in correctly spaced relation thereto.

With such a UHF oscillator tuning arrangement, various factors are effective to influence the linearity of the tuning characteristic even though the rotor plates 228 are cut to a high degree of accuracy to conform to a nominalized linear contour with respect to the stator plate 226. Thus, the stator plate portion 226 may vary in thickness, the dielectric properties of the post 232 may vary, the position of this post 232 on the tuner wall may vary and more or less solder may be used at the joint 234 which causes slight changes in capacity. These inaccuracies and tolerances are compensated for by means of a flat tab element 236 which is secured to the tuner wall 230 by any suitable means, such as soldering, and is positioned in the vicinity of the post 232 and may be bent toward or away from this post to provide very slight changes in capacity. Accordingly, variation of the position or shape of the tab 236 may be employed to correct the tuner alignment curve at the upper end of the frequency band while still maintaining the highly accurate and linear effect of the accurately punched rotor plates 228. In a similar manner, a small adjustment member 238 is secured to the terminal of the fixed capacitor 222 adjacent the end portion of the line 220 and is provided with a tab portion 240 which extends in close proximity to the adjacent wall of the tuner housing. The portion 240 may be adjusted to give slight variations in capacity at the lower end of the UHF band. In this connection it will be understood that the use of a trimming capacitor employing an adjustment screw would not be satisfactory because of the inductance introduced by the screw which causes spurious resonances in the UHF band. However, the thin flat tabs 236 and 240 provide the desired capacity adjustment without introducing undesired inductance effects. Preferably, the fixed capacitor 222 has a fixed capacitance value of approximately the same value as the capacity introduced by the rotor plates 228 and the stator portion 226 when these rotor plates are fully closed, this value being usually in the order of the ten picofarads. If desired, a midpoint adjustment may be made by providing a small loop of wire 241 positioned adjacent the midportion of the tuning element 220, the ends of the loop 241 being soldered to the housing wall to form a shorted turn inductance loop which may be moved toward or away from the line 220 to provide for further adjustment of the tuning characteristic during alignment. In this connection it will be understood that the unslotted rotor plates 226 may also be bent slightly at various points in the alignment procedure. However, such bending will produce relatively gentle or gradual variations in the tuning characteristic rather than the abrupt variation or discontinuity produced by bending one section of a slotted rotor plate.

While the UHF tuner of the present invention is preferably aligned in the manner described above so as to have an extremely linear tuning curve, it is still necessary to provide a separate fine tuning adjustment for the UHF tuner so that long term effects, such as thermal drift, aging of components, and the like, may be compensated and the operator can adjust the tuner at any indicated station to produce a picture of the desired characteristics. To this end, a fine tuning knob 250 is secured to the forward end of the fine tuning shaft 54 by positioning the same on a flat end portion 252 thereof. The gear 166 is provided with an arcuate slot 254 (FIG. 11) which is adapted to receive a tongue-like projection 256 provided on the rear end portion 170 of the channel selector shaft 56. The projection 256 and slot 254 thus form a lost motion connection between the selector shaft 56 and the fine tuning shaft 54 which permits a limited movement of the fine tuning shaft 54, and hench of the gear 166, while the selector shaft 56 remains at a particular detent position established by the wheel 72. Accordingly, when the fine tuning knob 250 is rotated the gear 166 is rotated while the clutch formed by the flange 160, the clutch pad 162, and the rear face of the gear 166 slips, so that the rotor shaft 58 may be adjusted by an amount equal to the movement of the tongue 256 within the slot 254 without changing the detent position of the channel selector shaft 56 or the setting of the dial discs 86 and 92. However, when the channel selector knob portion 84 is adjusted to a new UHF channel position, the gear 166 is carried to the new detent position established by the wheel 72 since the spring 172 is strong enough to prevent the clutch 160, 162 from slipping and the fine tuning shaft 54 rotates with the selector shaft 56. Accordingly, at any detent position of the wheel 72, i.e., at any one of the UHF positions of the channel selector shaft 56, the fine tuning knob 250 may be rotated by an amount determined by the arcuate slot 254 to provide a precise or fine tuning adjustment of the rotor shaft 58.

While the above-described fine tuning arrangement is effective to permit the customer to make a fine tuning adjustment at any UHF channel position of the selector shaft 56, the fine tuning knob 250 is positioned inside of the selector knob 84, whereas in conventional VHF tuners the fine tuning knob is positioned concentrically outside of the channel selector knob. In accordance with a further aspect of the invention, either of two different arrangements may be employed to provide a fine tuning knob arrangement which is concentric with and outside of the channel selector knob. One such arrangement is shown in FIGS. 15 and 16 and may be employed instead of the shaft and knob arrangement shown in the embodiment of FIGS. 1 to 14, inclusive.

Figures 15, 16:
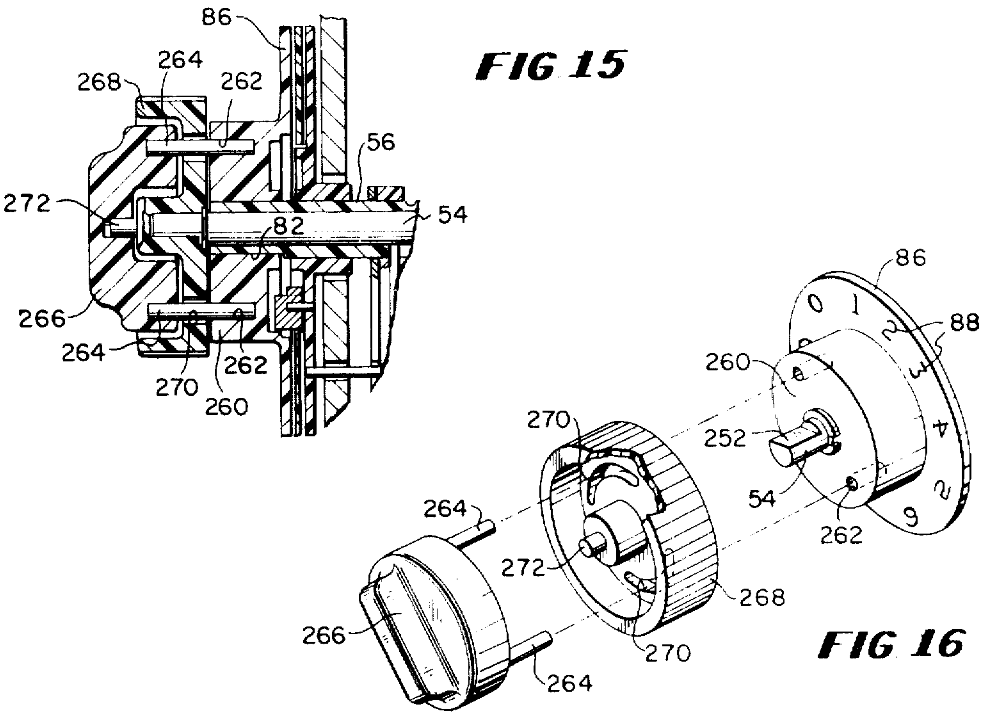
FIG. 15 is a fragmentary sectional view, similar to FIG. 4, of an alternative tuner arrangement wherein the fine tuning knob is positioned outside the UHF channel selector knob.
FIG. 16 is an exploded view of the shaft reversal arrangement of FIG. 15.

Referring to FIGS. 15 and 16, wherein similar reference numerals have been given to elements corresponding to those previously discussed in connection with the embodiment of FIGS. 1 to 14, inclusive, the units disc 86 is secured to the forward end of the channel selector shaft 56, in the manner described heretofore, and a hub portion 260 is provided integrally therewith which extends forwardly of the units disc 86 and is provided with a pair of diametrically opposed openings 262 therein which are adapted to receive a pair of rearwardly extending pins 264 which are connected to the centrally located channel selector knob 266. A fine tuning knob 268 is provided with a pair of arcuate slots 270 through which the pins 264 extend, thereby permitting a limited arcuate movement of the fine tuning knob 268 by grasping the knurled peripheral edge portion thereby which projects beyond the periphery of the channel selector knob 266. With this arrangement the channel selector knob 266 may be rotated to any desired UHF channel position and carries the fine tuning shaft 54 and knob 268 with it, as in the embodiment of FIGS. 1 to 14, inclusive, because the clutch 160, 162 does not slip under these conditions. However, after the channel selector knob 266 has been moved to a desired UHF channel position, the fine tuning knob 268 may be rotated independently of the knob 266 until the pins 264 strike the ends of the arcuate slots 270. A limited motion of the fine tuning shaft 54 is thus permitted in the arrangement of FIGS. 15 and 16, while providing concentric fine tuning in which the fine tuning knob is outside of the channel selector knob and may be adjusted independently of such channel selector knob. Further support for the channel selector knob 266 is provided by means of a forwardly projecting pin portion 272 at the center of the fine tuning knob 268, which fits into a corresponding recess in the rear face of the channel selector knob 266. As indicated in FIG. 16, the numerals on the tens and units discs 86 and 92 are arranged at a suitable radius to permit these numerals to be readily visible to the operator beyond the periphery of the fine tuning knob 268.

Figures 17, 20, 21, 22:
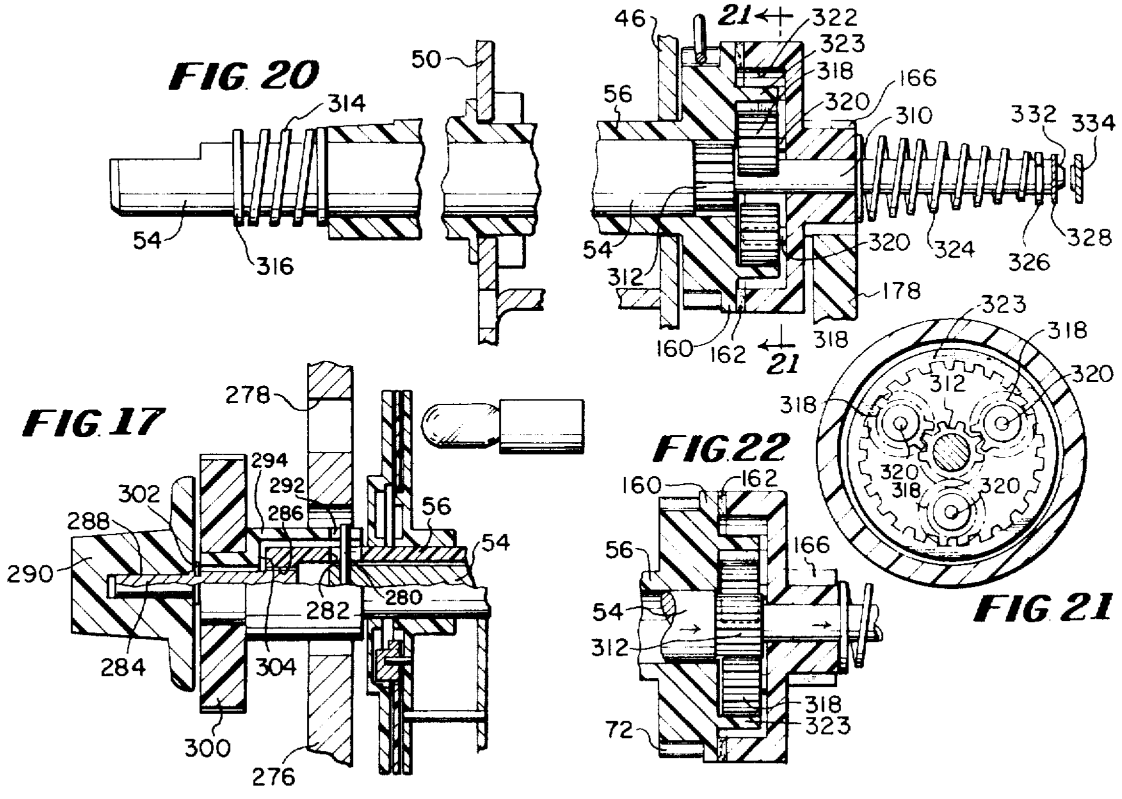
FIG. 17 is a fragmentary sectional view, similar to FIG. 4, of a further alternative embodiment of the present invention wherein the fine tuning knob is positioned outside the channel selector knob.
FIG. 20 is a longitudinal sectional view taken along the line 20—20 of FIG. 19.
FIG. 21 is a sectional view taken along line 21—21 of FIG. 20.
FIG. 22 is a fragmentary sectional view similar to FIG. 20 but showing the UHF fine tuning shaft in tuning position.

In FIGS. 17 and 18 an alternative selector knob and fine tuning knob arrangement is employed which may be substituted for the arrangement shown in the embodiment of FIGS. 1 to 14, inclusive, or the embodiment of FIGS. 15 and 16. Again, similar reference numerals have been employed for elements corresponding to previously discussed embodiments.

Referring to FIGS. 17 and 18, a shaft reversal arrangement is employed therein which permits the units dial 86 and tens dial 92 to be positioned behind the front panel 276 of the television cabinet, this front panel being provided with a viewing window 278 through which the tens and units numerals of the above-described UHF dial indicator arrangement may be seen. In this embodiment, a transversely extending pin 280 is secured to the forward end of the fine tuning shaft 54 and extends through a transverse slot 282 formed in the forward end of the channel selector shaft 56 ahead of the units disc portion 86. A channel extension 284 is press fitted into an opening 286 in the end of the selector shaft 56, the extension shaft 284 being provided with a flat 288 on the forward end thereof which is adapted to receive a channel selector knob 290. The pin 280 also extends through a longitudinally extending slot 292 which is formed in the rear skirt portion 294 of a fine tuning extension shaft 296, this extension being provided with a flat 298 which is adapted to receive an outer concentric fine tuning knob 300. The shaft extension 296 is retained in place by a retaining ring 302 in the forward direction and by engagement of the offset portion 304 thereof with the forward end of the channel selector shaft 56 in the other direction. In the embodiment of FIGS. 17 and 18, when the channel selector shaft extension 284 is rotated by means of the knob 290 the channel selector shaft 56 is directly rotated to the desired UHF channel position due to the direct connection of the extension 284 to the shaft 56. However, when a fine tuning operation is to be performed at a particular UHF station, rotation of the knob 300 is effective to rotate the fine tuning shaft 54 by engagement of the pin 280 with one of the sides of the slot 292, this rotation being independent of the channel selector shaft 56 since the pin 280 can move within the arcuate slot 282 without moving the shaft 56. A fine tuning adjustment is thus effected in the manner described in detail heretofore in connection with the embodiment of FIGS. 1 to 14, inclusive.

The UHF tuner of the present invention may also be equipped to function with conventional automatic frequency control (AFC) or automatic fine tuning (AFT) circuits in the associated television receiver by providing a variable capacity diode across the tuned circuit of the oscillator described in detail heretofore in connection with FIG. 14 of the drawings, as will be readily understood by those skilled in the art. Furthermore, when the accurate detent mechanism of the present invention is employed in conjunction with a UHF tuner having a linear alignment curve, as described heretofore, the AFC diode will function to bring the UHF tuner into exact tune with any one of the UHF channels at a particular detent position established by the wheel 72 so that an operation comparable with the memory or preset type of UHF tuner may be achieved while permitting the selection of a channel in the UHF band and a nonambiguous dial indication of the exact channel selected.

In this connection it will be understood that the normal pull-in range of an AFC control circuit is considerably less than 3 megacycles (the maximum alignment deviation discussed above) and is conventionally about 1.2 megacycles. However, the UHF channels received in a particular area are usually grouped in a frequency range which is much smaller than the total UHF band. Accordingly, when the UHF tuner is aligned in the manner described above to have a gently varying alignment characteristic, the manual fine tuning may be adjusted for a desired picture at any one of the receivable stations in that area and the AFC control circuit will have sufficient range to pull-in to exact tuning the other stations receivable in that area. This is because the gradually varying alignment curve, which is free from sudden nonlinearities, will insure that other stations relatively close to the one at which the fine tuning operation was performed will be much closer to exact alignment than three megacycles.

However, when AFC control of the UHF oscillator is employed to provide the equivalent of mechanically preset memory UHF tuners, it is desirable to disconnect or defeat the AFC control voltage during the manual fine tuning operation so that tuning can be optimized at any particular UHF station without any arbitrary corrective influences due to the AFC control circuit. In such instance it is desirable to require the manual fine tuning operation to be performed by a unique manipulation of the fine tuning knob by the operator which can be utilized to defeat the AFC control circuit.

In FIGS. 19 to 22, an alternative embodiment of the present invention is disclosed wherein the UHF tuner is arranged to function with an AFC control voltage from the associated receiver and the AFC control lead is defeated or disabled during the manual fine tuning operation. Furthermore, the AFC control circuit is defeated each time the channel selector knob is moved to a different UHF channel so that pull-in by the AFC control circuit to an adjacent channel not corresponding to the one indicated is prevented. More particularly, in the arrangement of FIGS. 19 to 22, inclusive, the fine tuning shaft 54 is arranged to be pushed inwardly by the operator when a manual fine tuning operation is to be performed, this rearward movement of the fine tuning shaft 54 being employed to actuate an AFC defeat switch. Thus, the rear end portion 310 of the fine tuning shaft 54 is made of circular cross section so that it can rotate freely within the gear 166.

The fine tuning shaft 54 is also provided with a concentric gear portion 312 which is positioned between the main body of the shaft 54 and the reduced end section 310 thereof. A coil spring 314 is positioned between the end of the selector shaft 56 and a retaining ring 316 on the forward end of the fine tuning shaft 54, the spring 314 acting normally to urge the fine tuning shaft 54 to a forward position shown in FIG. 20 in which the gear 312 is out of mesh with a series of planetary gears 318 which are mounted on the posts 320 carried by the gear 166, the planetary gears 318 being positioned within a forwardly opening recess 322 in the gear 166 and engaging an internally toothed ring gear 323 formed integrally with the selector shaft 56 and extending into the recess 322. A coil spring 324 is positioned between the end of the gear 166 and a collar 326 secured to the end portion 310 of the fine tuning shaft 54, the spring 324 being weaker than the spring 314 but sufficiently strong that the clutch comprising the flange 160, the clutch pad 162 and the forward annular face of the gear 166 does not slip as the selector shaft 56 is rotated.

When the selector shaft 56 is rotated to different UHF channel positions, the fine tuning shaft 54 may remain stationary or may ride with the channel selector shaft 56 if substantial frictions between the gear 166 and the end portion 310 are experienced. However, when the selector shaft 56 has been adjusted to a particular UHF channel position, the fine tuning shaft 54 may be moved rearwardly by the operator to the position shown in FIG. 22 so that the sun gear 312 is moved into engagement with the planetary gears 318. The operator then rotates the shaft 54 while in this rearward position so as to cause a rotation of the gear 166 while the clutch 160, 162 slips because the spring 324 is relaxed when the shaft 54 is moved to the rear position shown in FIG. 22. The ratio at which the gear 166 is driven in response to rotation of the shaft 54 may also be chosen to give any desired ratio of movement of the rotor shaft 58 in response to a given angular movement of the fine tuning shaft 54.

When the fine tuning shaft 54 is moved rearwardly, one spring arm 328 of an AFC defeat switch 330 is moved rearwardly by engagement of the end portion 310 therewith so that the contact 322 (FIG. 20) carried thereby engages a corresponding contact carried by the switch arm 334. When the contacts of the switch 330 are closed the AFC control voltage may be either short circuited or grounded so that the AFC control circuit of the associated receiver is no longer effective to control tuning of the UHF oscillator. Accordingly, during the period when the fine tuning shaft 54 is rotated to effect a manual fine tuning operation of the UHF oscillator the associated AFC control circuit is defeated.

In the embodiment of FIGS. 19 to 22, inclusive, the AFC control circuit is also defeated each time the channel selector shaft 56 is moved to a different UHF channel position. More particularly, in the embodiment of FIGS. 19 to 22, inclusive, the tip portion 336 of the torsion spring 60 is positioned beneath the bottom spring contact 338 of a second AFC defeat switch 340 having an upper spring contact 342, the contacts carried by the arms 338 and 342 being normally open when the V-shaped end portion 70 of the torsion spring 60 is positioned within one of the notches in the detent wheel 72, as shown in FIG. 19. When the channel selector shaft 56 is rotated to another UHF channel position, the adjacent lobe on the detent wheel 72 raises the end portion 336 of the torsion spring 60 so that the contacts carried by the spring arms 338 and 342 are closed. Closure of these switch contacts is again employed to short circuit or ground the AFC control voltage so that the UHF oscillator is not subjected to the influence of the AFC control coltage while a new UHF channel is being selected. However, as soon as the V-shaped portion 70 falls into the selected notch of the detent wheel 72, the contacts carried by the spring arms 338 and 342 are opened and AFC control is restored. The defeat switch 340 is conveniently mounted on a rearwardly extending portion 344 of the chassis wall 46 and the defeat switch 330 is mounted on a depending end portion 346 of the bracket portion 344.

In FIGS. 23 and 24 of the drawings a further alternative embodiment of the invention is disclosed wherein a common AFC defeat switch 350 is actuated in response to both a push-to-engage fine tuning operation or a channel selection in response to rotation of the channel selector shaft 56. Referring to these FIGURES, wherein similar reference numerals are employed for elements common to the embodiment of FIGS. 19 to 22, inclusive, the torsion spring 60 is provided with a rearwardly extending right angle end portion 352 which extends through a vertically extending slot 354 provided in a control member 356 which is rotatably mounted on a post 358 secured to the chassis wall 46. A cone shaped camming member 360 is secured to the end portion 310 of the fine tuning shaft 54, the cone shaped member being provided with a forwardly opening recess 362 within which is positioned a coil spring 364 which maintains the clutch 160, 162 normally effective to rotate the gear 166 in response to rotation of the channel selector shaft 56. The member 360 is retained on the end portion 310 by means of the retaining washers 365 and 367.

When the fine tuning shaft 54 is moved rearwardly from the position shown in FIG. 24, the gear 312 engages the gears 318 and effects a fine tuning operation in the manner described heretofore in connection with FIGS. 19 to 22, inclusive. Also, when the shaft 54 is moved rearwardly the cam member 360 moves with the shaft 54 and pivots the control member 356 about the post 358 so that a projection 366 on the upper edge of the control member 356 is effective to move the spring arm 368 of the switch 350 upwardly and close the contacts carried by the spring arms 368 and 370 thereof. When the fine tuning operation is completed and the shaft 54 is released, the spring 314 moves the fine tuning shaft forwardly and the cam member 360 is withdrawn so that the control member 356 moves back to the position shown in FIG. 23 and the switch 350 is opened. Closure of the switch 350 is employed to effect disabling of the AFC circuit of the associated receiver in the manner described in detail heretofore.

When the channel selector shaft 56 is rotated, the end portion 352 of the torsion spring 60 is moved upwardly and also functions to pivot the control member 356 about the post 358 so that the contacts of the switch 350 are closed. Again, the AFC control voltage is short circuited or grounded so that the AFC control voltage is no longer effective to control the tuning of the UHF oscillator during selection of a new UHF channel. However, the control member 356 may be moved upwardly during a fine tuning operation without moving the torsion spring 60 since the slot 354 permits such upward movement without disturbing the position of the V-shaped portion 70 of the torsion spring 60. Accordingly, the above-described detent action is maintained during the UHF fine tuning operation while employing only the single AFC defeat switch 350 in the embodiment of FIGS. 23 and 24.

In FIGS. 25 and 26, a further alternative embodiment of the present invention is disclosed wherein an electronic fine tuning arrangement is employed instead of the mechanical ones described heretofore. Referring to FIGS. 25 and 26, wherein similar reference numerals are employed, a potentiometer indicated generally at 372 is mounted on a bracket extension 374 of the chassis wall 46 and the rotary shaft 376 thereof is connected to the end portion 310 of the fine tuning shaft 54, which is of circular cross section. A universal coupling indicated generally at 378 is provided to interconnect the shafts 310 and 376, the coupling 378 having a first bushing 380 secured to the shaft portion 310 and a second bushing 382 connected to the potentiometer shaft 376. The potentiometer 372 is provided with the terminals 384 and 386 connected to the ends of the potentiometer winding, and a terminal 388 connected to the slider of this potentiometer.

In FIG. 25, the potentiometer 372 is shown connected across a balanced unidirectional control voltage source, illustrated by the batteries 390 and 392, the junction of these batteries being connected ground so that movement of the potentiometer arm varies the voltage at the terminal 388 above and below ground. This terminal is connected through a resistor 394 to one side of an AFC control diode 396, the other side of this diode being connected through a resistor 398 to a terminal 400 to which the conventional AFC control voltage is supplied from the associated television receiver. The diode 396 is connected across the inductance element 220 and variable capacitance element 226, 228, which form the tank circuit of the transistor oscillator 402, through the isolating capacitors 404 and 406. In the embodiment of FIGS. 25 and 26, the potentiometer 372 is not moved while different UHF channels are being selected by manipulation of the channel selector shaft 56 since the gear 166 simply rotates about the cylindrical end portion 310 of the fine tuning shaft 54, the clutch 160, 162 of previous embodiments being eliminated. However, when a fine tuning operation is to be performed manually, at a particular UHF station, the shaft 54 is rotated so that the potentiometer 372 is adjusted to provide a different D.C. voltage for the AFC diode 396, thereby effecting a fine tuning operation of the UHF oscillator 402 in a manner understood by those skilled in the art. Any desired range of fine tuning may be provided by varying the voltage range over which the potentiometer 372 may be adjusted, as will be readily understood by those skilled in the art.

Figure 27:
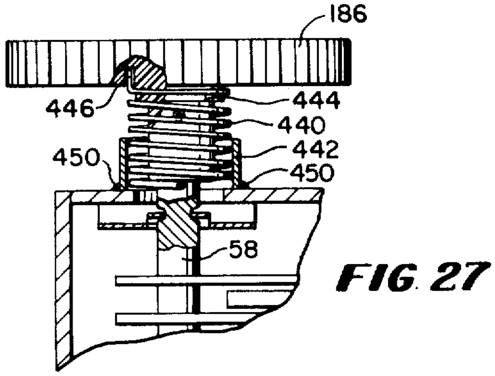
FIG. 27 is a fragmentary bottom view, similar to FIG. 3 but on a larger scale, and showing an alternative arrangement for spring loading the tuner main tuning shaft.
Figure 28:
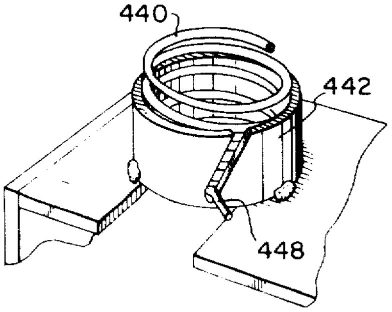
FIG. 28 is a perspective view of the loading arrangement of FIG. 27.

In FIGS. 27 and 28 of the drawings, an alternative arrangement is shown for exerting the above-described loading or biasing force on the rotor shaft 58. Referring to these figures, the rotor shaft 58 in the embodiment of FIGS. 27 and 28 is solid and a coil spring 440 is employed externally of the UHF tuner housing to exert the desired spring loading effect on this shaft. More particularly, a coil spring 440 is positioned between the gear 186 and the rear end of the UHF tuner housing, the bottom turns of the coil spring 440 being positioned within an upstanding collar or centering sleeve 442 which is secured to the adjacent tuner housing wall by means of the solder joints 450.

The upper end of the coil spring 440 is provided with a right angle end portion 446 which is insertable in a suitable opening in the gear 186, as shown in FIG. 27, the uppermost turn of the spring 440 being positioned by a flange portion 444 which is of larger diameter than the remaining hub portion of the gear 186, so that the remaining turns of the spring 440 do not touch this hub as the gear 186 is rotated. The bottom end 448 of the coil spring 440 is positioned within a slot in the collar 442, as shown in FIG. 28, so that the bottom end of the coil spring 440 is restrained while the top end of this coil spring rotates with the gear 186. If desired, a number of similar slots may be provided around the periphery of the collar 442 so that the end position 448 may be readily adjusted to any desired mount of loading of the shaft 58 by positioning the end 448 in the appropriate one of said slots.

The inner diameter of the sleeve 442 is just slightly larger than the bottom turns of the coil spring 440 so that this sleeve acts as a centering device to prevent the turns of the spring 440 from engaging the hub of the gear 186 as the rotor shaft 58 is moved through approximately 180° during tuning to various stations in the UHF band. It has been found that if the turns of the coil spring 440 are permitted to touch the hub portion of the gear 186 at any point, during the rotation of the shaft 58, undesired side thrust is exerted on this shaft which can seriously interfere with the precise reset characteristics of the detent mechanism described heretofore in connection with the embodiment of FIGS. 1 to 14, inclusive.

While the torsion spring 212 (FIG. 3) of the embodiment of FIGS. 1 to 14, inclusive, also avoids such side thrust, the provision of the hole 208 in the rotor shaft 58 is quite expensive whereas in the spring loading embodiment of FIGS. 27 and 28 the rotor shaft 58 may be solid and hence considerably less expensive than the arrangement shown in FIG. 3.

Figure 29:
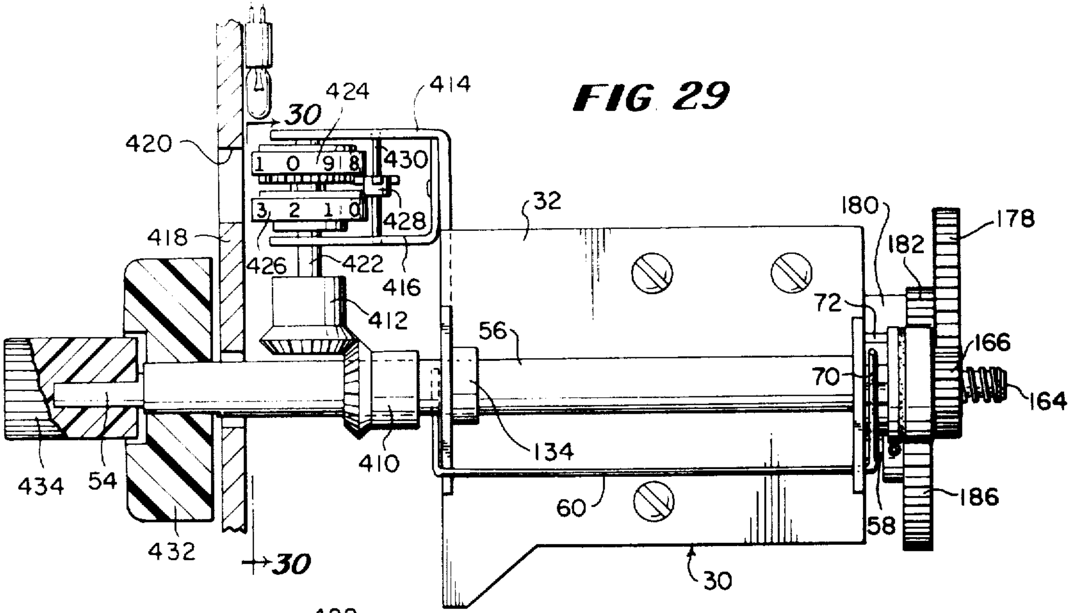
FIG. 29 is a top plan view of a further alternative embodiment of the invention wherein frontal space required by the tuner mechanism is minimized.
Figure 30:
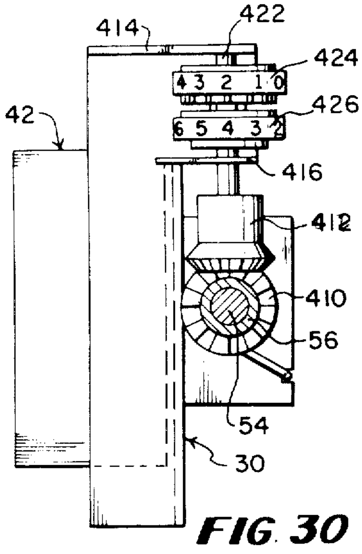
FIG. 30 is a sectional view taken along the line 30—30 of FIG. 29.

In certain instances a minimal frontal area for the UHF tuner is desirable in connection with a particular design of television receiver. In the embodiment of FIGS. 29 and 30 an arrangement is provided whereby the frontal area of the UHF tuner mechanism and particularly the UHF dial arrangement is minimized. Referring to FIGS. 29 and 30 wherein corresponding numerals have been employed for elements similar to those described previously in connection with the embodiment of FIGS. 1 to 14, inclusive, a decade dial arrangement is provided which comprises a units dial 426 and a tens dial 424, the numbers for these dials appearing on the periphery of a pair of counter wheels which are aligned vertically, the wheel 426 being mounted on a shaft 422 which is carried by the bracket portions 414 and 416 of the main chassis 32, and the wheel 424 being rotatably mounted on the shaft 422 and spaced above the wheel 426.

A first bevel gear 410 is secured to the channel selector shaft 56 ahead of the forward end of the torsion spring 60 and is in engagement with a bevel gear 412 secured to the vertically positioned shaft 422. The units dial 426 is secured to and rotates with the shaft 422, this dial making one revolution for each revolution of the selector shaft 56. A trip pinion 428 is mounted on a shaft 430 which is positioned between the upper and lower bracket 430 which is positioned between the upper and lower bracket members 414 and 416, the trip pinion 428 having teeth which engage with corresponding teeth on the tens dial 424 and being rotated one tens digit increment for each revolution of the units dial 426 by means of tripper teeth similar to the teeth 116 in the embodiment described heretofore in connection with FIGS. 1 to 14, inclusive.

In the embodiments of FIGS. 29 and 30 the channel selector shaft 56 extends out through an opening in the front panel 418 of the television cabinet, a channel selector knob 432 being secured to the forward end of this shaft outside the front panel 418. Also, the fine tuning shaft 54 extends outwardly beyond the channel selector shaft 56 and a fine tuning knob 434 is secured to the end of the shaft 54. The panel 418 is provided with an opening 420 through which the vertically aligned tens and units digits of the dials 424 and 426, respectively, are visible so that a nonambiguous digital dial indication of the UHF channel being received is provided. If desired, these digits may be illuminated by a suitable indicator lamp positioned behind the panel 418.

As will be evident from FIG. 30, the frontal area of the arrangement of FIGS. 29 and 30 is extremely small, since the UHF tuner 42 is positioned on edge and the dials 424 and 426 occupy a very small amount of frontal area of the television cabinet. In this connection it will be understood that the dials 424 and 426 may be of even smaller diameter than shown in FIGS. 29 and 30 and the tens and units digits appearing thereon may be made larger than shown in these figures so that an extremely compact UHF dial indicator arrangement may be provided. In other respects, the embodiment of FIGS. 29 and 30 is similar to the arrangement described in detail heretofore in connection with FIGS. 1 to 14, inclusive.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. The combination of, a UHF tuner having a continuously variable main tuning shaft rotation of which is effective selectively to receive signals from all stations in the UHF television band, a station selector shaft, gear means interconnecting said selector shaft and said main tuning shaft, a star wheel disposed concentrically about said selector shaft for rotation therewith, a spring member engageable by said star wheel to establish a stop position of said main tuning shaft for each of the seventy television stations in the UHF band, a fine tuning shaft positioned inside of said selector shaft, said fine tuning shaft being normally biased to a forward position and being movable to a rear position, means responsive to the rotation of said fine tuning shaft while it is in said rear position for effecting a fine tuning operation at each of said stop positions of said main tuning shaft, said fine tuning shaft being disengaged from said selector shaft when said fine tuning shaft is in said forward position and wherein said UHF tuner is provided with automatic frequency control means normally responsive to a control signal, switching means affixed to said television tuner and electrically coupled to said automatic frequency control circuit, actuation of said switching means being effective to defeat the operation of said automatic frequency control circuit, means mechanically interconnecting said selector shaft and said switching means, said interconnecting means including a pivotable lever engageable by said spring member upon rotation of said selector shaft, said lever being effective to actuate said switching means in response to engagement thereof by said spring member, means responsive to the longitudinal movement of said fine tuning shaft for engaging said lever and actuating said switching means upon movement of said fine tuning shaft to said rear position, said longitudinal movement responsive means including a camming member having a nonuniform circular cross section along a central axis thereof, said camming member being mounted coaxially with said fine tuning shaft and said star wheel and movable along said central axis in response to the longitudinal movement of said fine tuning shaft, said lever being engageable by said camming member for actuating said switching means upon longitudinal movement of said fine tuning shaft to said rear position.

2. The improvement recited in claim 1 wherein said camming member is rotatably affixed to said fine tuning shaft.

3. The improvement recited in claim 1 wherein said spring member comprises a torsional detenting spring having a V-shaped member for engaging said star wheel, and wherein said switching means is engageable by an end of said V-shaped member.

4. In a television tuner of the type having a selector shaft rotation of which is effective to tune said tuner to one of a plurality of discrete frequencies, a fine tuning shaft longitudinally movable to a forward and a rear position, depression and rotation of which is effective to tune said tuner over a predetermined range of frequencies about said discrete frequencies, and an automatic frequency control circuit, the improvement comprising:

a star wheel affixed to said selector shaft for rotation therewith, and a spring member engageable by said star wheel, said star wheel and said gear member cooperating to provide a plurality of detent positions for said selector shaft;

switching means affixed to said television tuner and electrically coupled to said automatic frequency control circuit, actuation of said switching means being effective to defeat the operation of said automatic frequency control circuit, said switching means including a first and a second switch, said first switch being actuable by said fine tuning shaft upon longitudinal movement of said fine tuning shaft to said rear position, said second switch being actuable by said spring member upon rotation of said selector shaft between detent positions of said star wheel.

* * * * *